US012761253B2

(12) United States Patent
Tan et al.

(10) Patent No.: US 12,761,253 B2
(45) Date of Patent: Oct. 13, 2026

(54) DETECTION CIRCUIT AND POWER MANAGEMENT SYSTEM INCLUDING THE SAME

(71) Applicant: SG MICRO CORP, Beijing (CN)

(72) Inventors: Lei Tan, Beijing (CN); Changyan Chen, Beijing (CN); Haibo Zhang, Beijing (CN)

(73) Assignee: SG MICRO CORP, Beijing (CN)

(*) Notice: Subject to any disclaimer, the term of this patent is extended or adjusted under 35 U.S.C. 154(b) by 212 days.

(21) Appl. No.: 18/714,117

(22) PCT Filed: Aug. 18, 2022

(86) PCT No.: PCT/CN2022/113212

§ 371 (c)(1),
(2) Date: May 29, 2024

(87) PCT Pub. No.: WO2023/124119

PCT Pub. Date: Jul. 6, 2023

(65) Prior Publication Data

US 2025/0020705 A1 Jan. 16, 2025

(30) Foreign Application Priority Data

Dec. 27, 2021 (CN) ......................... 202111614920.9

(51) Int. Cl.
*G01R 19/257* (2006.01)
*G01R 19/165* (2006.01)

(52) U.S. Cl.
CPC ..... *G01R 19/257* (2013.01); *G01R 19/16533* (2013.01); *G01R 19/16576* (2013.01)

(58) Field of Classification Search
CPC ............ G01R 19/257; G01R 19/16533; G01R 19/16576; G01R 19/25; H02M 3/00
See application file for complete search history.

(56) References Cited

U.S. PATENT DOCUMENTS 4,573,005 A 2/1986 van de Plassche
6,218,888 B1 4/2001 Otsuki (Continued)

FOREIGN PATENT DOCUMENTS

CN 101350621 A 1/2009
CN 102014017 A 4/2011

(Continued)

OTHER PUBLICATIONS

International Search Report (including English translation) and Written Opinion for International Application No. PCT/CN2022/113212, dated Nov. 14, 2022, 11 pages.

(Continued)

*Primary Examiner* — Akm Zakaria
(74) *Attorney, Agent, or Firm* — Westman, Champlin & Koehler, P.A.

(57) ABSTRACT

The present application discloses a detection circuit and a power management system including the detection circuit. The detection circuits include a threshold voltage generation circuit, a voltage-to-current conversion circuit, and a current-type successive approximation quantizer. The voltage-to-current conversion circuit converts an offset voltage of a signal to be detected into a proportional current with respect to a threshold voltage which is generated by the threshold voltage generation circuit. The current-type successive approximation quantizer obtains a comparison result between the signal to be detected and the threshold voltage, or a quantization result of the signal to be detected within a window by quantizing the proportional current. Thus, the circuit structure is simplified and the cost is reduced.

14 Claims, 5 Drawing Sheets

100

(56) References Cited

U.S. PATENT DOCUMENTS

| | | | | |
|---|---|---|---|---|
| 7,626,527 | B1 * | 12/2009 | Wang | H03M 3/366 341/143 |
| 8,471,751 | B2 | 6/2013 | Wang | |
| 8,564,470 | B2 * | 10/2013 | Bogner | H03M 1/46 341/163 |
| 8,928,307 | B2 | 1/2015 | Wang | |
| 9,041,580 | B2 | 5/2015 | Okura et al. | |
| 9,590,652 | B2 | 3/2017 | Okura et al. | |
| 10,345,845 | B1 | 7/2019 | Chen et al. | |
| 10,541,692 | B1 | 1/2020 | Zamprogno et al. | |
| 11,057,022 | B2 | 7/2021 | Zamprogno et al. | |
| 11,470,274 | B2 | 10/2022 | Nakagawa et al. | |
| 2008/0252502 | A1 * | 10/2008 | Maeda | H03M 3/364 341/143 |
| 2012/0081103 | A1 | 4/2012 | Wang | |
| 2012/0319878 | A1 | 12/2012 | Bogner et al. | |
| 2013/0002467 | A1 | 1/2013 | Wang | |
| 2014/0203790 | A1 | 7/2014 | Xiao et al. | |
| 2014/0362273 | A1 | 12/2014 | Okura et al. | |
| 2015/0236712 | A1 | 8/2015 | Okura et al. | |
| 2016/0269011 | A1 * | 9/2016 | Uehara | G01P 15/09 |
| 2020/0412344 | A1 | 12/2020 | Zamprogno et al. | |
| 2021/0306585 | A1 | 9/2021 | Nakagawa et al. | |
| 2021/0389353 | A1 * | 12/2021 | Bhargava | G01R 31/40 |

FOREIGN PATENT DOCUMENTS

| | | | |
|---|---|---|---|
| CN | 202267706 | U | 6/2012 |
| CN | 102832937 | A | 12/2012 |
| CN | 102014017 | B | 10/2013 |
| CN | 103650349 | A | 3/2014 |
| CN | 104243866 | A | 12/2014 |
| CN | 204013226 | U | 12/2014 |
| CN | 107063452 | A | 8/2017 |
| CN | 112640435 | A | 4/2021 |
| CN | 213122962 | U | 5/2021 |
| CN | 213152021 | U | 5/2021 |
| CN | 214205499 | U | 9/2021 |
| JP | H09252126 | A | 9/1997 |
| JP | 2016092648 | A | 5/2016 |
| TW | 201003081 | A | 1/2010 |
| TW | I710215 | B | 11/2020 |

OTHER PUBLICATIONS

First Office Action, including Search Report, for Chinese Patent Application No. 202111614920.9, dated Mar. 6, 2024, 21 pages.

Tan Lei, "The challenge of moving the power with the CPU core," World Electronic Components, Issue 09, Dec. 31, 1999.

Cui Fuliang et al., "A current-voltage conversion circuit for a digital-to-analog converter," Solid State Electronics Research and Progress, vol. 24, Issue 04, Dec. 30, 2004.

Qu Ke ke et al., "A 5 V low voltage differential linear regulator integrated in a BUCK chip," Electronics and Packaging, vol. 21, Issue 7, Jul. 31, 2021.

* cited by examiner

DETECTION CIRCUIT AND POWER MANAGEMENT SYSTEM INCLUDING THE SAME

CROSS REFERENCE TO RELATED APPLICATION(S)

This application is a Section 371 National Stage Application of International Application No. PCT/CN2022/113212, filed on Aug. 18, 2022, which published as WIPO Publication No. 2023/124119 A1, on Jul. 6, 2023, not in English, which claims priority to Chinese invention application No. 202111614920.9, filed on Dec. 27, 2021, and entitled "DETECTION CIRCUIT AND POWER MANAGEMENT SYSTEM INCLUDING THE SAME", the contents of which are incorporated herein by reference in their entireties.

TECHNICAL FIELD

The present disclosure relates to the technical field of circuits, and more particularly to a detection circuit and a power management system including the same.

BACKGROUND

In a system with complex power supply requirements, a plurality of DC/DC converters are typically used to supply power required for different semiconductor devices. One obvious result is that control and monitoring of these power supplies will become more complex when designing a product, testing the product, and in daily use of the product.

Today, many high-performance DC/DC converters are still controlled by analog signals generated by passive components. Even in the most-advanced power circuit topology, external potentiometers and capacitors have to be used to adjust parameters such as a startup time, an output voltage value, and a switching frequency. Moreover, these parameters cannot be changed at any time.

The Power Management Bus (PMBus) open-standard specification defines a digital communication protocol for controlling power conversion and managing devices, in which data transmission, physical interfaces and command languages are defined to enable the converter to communicate with other devices. Conventional DC/DC converters, such as IR35201 and PXE1610, internally integrate a large number of different types of Analog-to-Digital Converters (ADCs) and Digital-to-Analog Converters (DACs) to achieve the function of monitoring a plurality of parameters. A large number of components need to be integrated in the circuit, which greatly increases the area and cost of the chip.

SUMMARY

In view of this, one aspect of the present disclosure is to provide a detection circuit with a simple structure and a power management system including the detection circuit. The detection circuit is designed with demand-oriented optimization, and completes monitoring and setting of all parameters with a single structure, thereby greatly reducing the area and cost of the circuit.

According to an aspect of an embodiment of the present disclosure, there is provided a detection circuit comprising: a threshold voltage generation circuit for generating a threshold voltage: a voltage-to-current conversion circuit for converting an offset voltage of a signal to be detected with respect to the threshold voltage into a proportional current; and a current-type successive approximation quantizer which is used to obtain a detection result by quantizing the proportional current.

Optionally, the detection result is a comparison result of the signal to be detected and the threshold voltage, or a quantization result of the signal to be detected within a window defined by the threshold voltage.

Optionally, the detection circuitry further comprises: a differential sampling switch configured to provide the voltage-to-current conversion circuit with an offset voltage or a reference ground:

Optionally, the voltage-to-current conversion circuit comprises: a storage capacitor, with a first end being coupled with an output of the threshold generation circuit and an input terminal for receiving the signal to be detected; a first transistor having a control terminal being coupled with a second end of the storage capacitor; a first resistor having a first end being coupled with a second terminal of the first transistor, and a second end being coupled to the offset voltage or the reference ground via the differential sampling switch; and a second transistor having a control terminal for receiving a bias voltage, a second terminal being coupled with a first terminal of the first transistor, and a first terminal for outputting the proportional current.

Optionally, the current-type successive approximation quantizer comprises: an operational amplifier having a first input terminal being coupled with a first terminal of the second transistor and a second input terminal being coupled to a clamping voltage: a current source array which is used to generate a reference current according to the clamping voltage and provide the reference current to the first input terminal of the operational amplifier, and a comparator which is coupled with an output terminal of the operational amplifier, is used to quantize an output of the operational amplifier into the comparison result.

Optionally, the reference current provided by the current source array has a constant current value when the detection result is a result of comparing the signal to be detected with the threshold voltage.

Optionally, the reference current provided by the current source array has a varied current value when the detection result is a quantization result of the signal to be detected within the window defined by the threshold voltage, the quantization result being obtained by adjusting the current value of the reference current.

Optionally, the current-type successive approximation quantizer further comprises: an SAR logic circuit which controls switching operations of the current source array according to the comparison result, and adjusts a current value of the reference current in a successive approximation manner, until the quantization ends.

Optionally, the detection circuit further comprises: a first switch, configured to couple a first end of the storage capacitor with an output of the threshold voltage generation circuit at a threshold establishment stage: a second switch, configured to couple the first end of the storage capacitor with the input terminal for receiving the signal to be detected at a detection stage.

Optionally, the detection circuit further comprises: a third switch, configured to couple the first end of the storage capacitor to ground at a first sub-stage of the threshold establishment stage for resetting charge.

Optionally, the threshold establishment stage further includes a second sub-stage following the first sub-stage, and the threshold voltage generation circuit is configured to generate the threshold voltage at the second sub-stage.

Optionally, the voltage-to-current conversion circuit further comprises: a fourth switch, configured to coupled the control terminal and the first terminal of the first transistor at the threshold establishment stage.

Optionally, the detection circuit has a plurality of input terminals, and the detection circuit is configured to detect signals to be detected at the plurality of input terminals in a time-division manner.

Optionally, the detection circuit further comprises a register array for storing a plurality of control codes corresponding to the signals to be detected at the plurality of input terminals, and the threshold voltage generation circuit generating threshold voltages respectively according to the control codes provided by the register array.

Optionally, the threshold voltage generation circuit is a capacitive digital-to-analog converter.

According to another aspect of an embodiment of the present disclosure, there is provided a power management system comprising the above-described detection circuit.

In summary, the detection circuit according to the present disclosure generates a lower voltage limit by a capacitive DAC, converts a signal to be detected into a current with respect to the lower voltage limit by a voltage-to-current conversion circuit, quantizes the current by a current-type successive approximation quantizer, and finally obtains a comparison result of the signal to be detected and the lower voltage limit, or a quantization result of the signal to be detected within a window. This simpler circuit structure significantly reduces the area of the power management system utilizing this detection circuit, thereby decreasing the circuit cost.

BRIEF DESCRIPTION OF THE DRAWINGS

The foregoing and other objects, features and advantages of the present disclosure will become clearer by the following description of embodiments of the present disclosure with reference to accompanying drawings.

DETAILED DESCRIPTION

Figure 1:
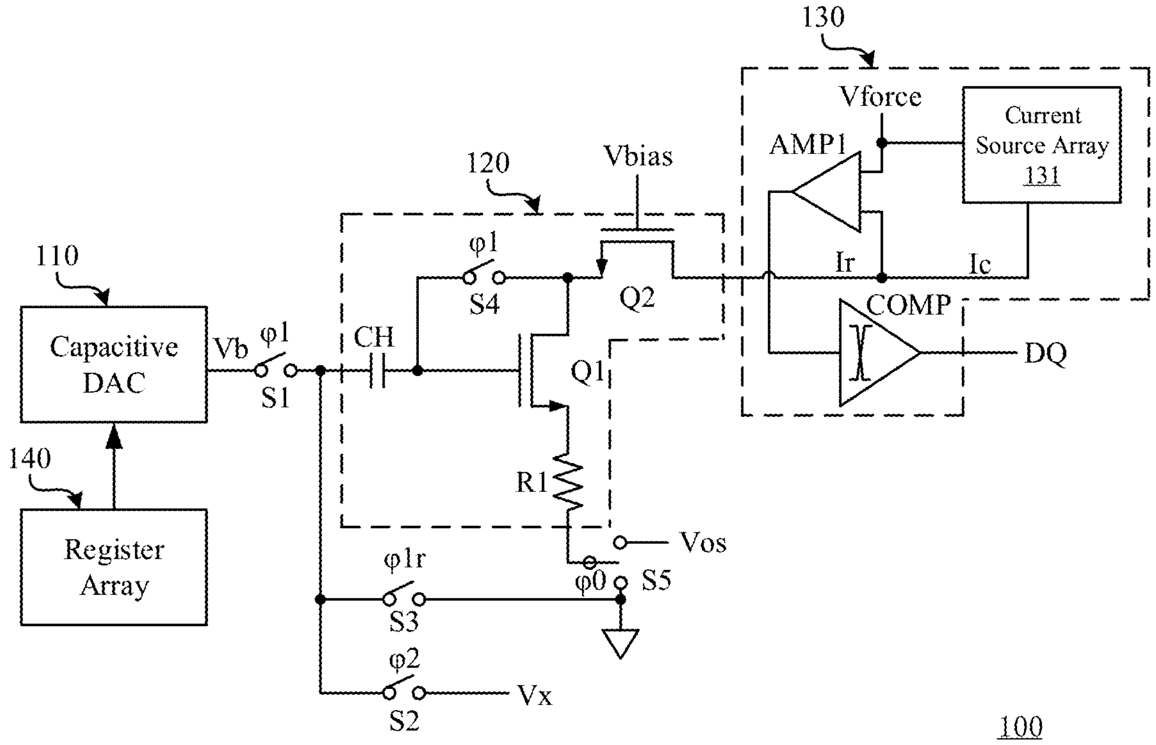
FIG. 1 shows a schematic diagram of structure of a detection circuit according to a first embodiment of the present disclosure.

The present disclosure will be described in more detail below with reference to the accompanying drawings. In various figures, the same elements are denoted by similar reference numerals. For the sake of clarity, various parts in the accompanying drawings are not drawn to scale. Moreover, certain well-known parts may not be shown in the figures.

Many specific details of the present disclosure, such as the structure, material, dimensions, treatment processes, and techniques of the components, are described below in order to more clearly understand the present disclosure. However, as will be appreciated by those skilled in the art, the present disclosure may not be implemented in accordance with these specific details.

It should be understood that in the following description, the word "circuit" may include single or multiple combinations of hardware circuits, programmable circuits, state machine circuits, and/or components capable of storing instructions which are executed by a programmable circuitry. When a component or a circuit is said to be "connected" or "coupled" to another component, or a component/circuit is said to be "connected" or "coupled" between two nodes, it may be directly coupled or connected to the other component or with an intermediate component therebetween. The connection or coupling between the components may be physical, logical, or a combination thereof. Conversely, when the component is said to be "directly coupled" or "directly connected" to another component, it means that there is no intermediate component therebetween.

FIG. 1 shows a schematic diagram of structure of a detection circuit according to a first embodiment of the present disclosure. As shown in FIG. 1, the detection circuit 100 includes a threshold voltage generation circuit 110, a voltage-to-current conversion circuit 120, and a current-type successive approximation quantizer (SAR ADC) 130, and switches S1-S5. Here, the threshold voltage generation circuit 11 is used to generate a threshold voltage Vb, the voltage-to-current conversion circuit 120 converts an offset voltage of a signal Vx to be detected into a proportional current Ir with respect to the threshold voltage Vb, in a time-division subtraction manner, and the current-type successive approximation quantizer 130 is used to receive the proportional current Ir and quantize the proportional current Ir to obtain a detection result. The detection result indicates a comparison result between the signal Vx to be detected and the threshold voltage Vb.

The voltage-to-current conversion circuit 120 includes a storage capacitor CH, transistors Q1 and Q2, and a resistor R1. A first end of the storage capacitor CH is coupled to the threshold voltage generation circuit 110 via the switch S1, and is coupled with an input terminal for receiving the signal Vx to be detected via the switch S2, and a second end of the storage capacitor CH is coupled with a control terminal of the transistor Q1. The switch S4 is coupled between the control terminal and a first terminal of the transistor Q1. A second end of the transistor Q1 is coupled with a first end of the resistor R1, and a second end of the resistor R1 is coupled to the offset voltage $V_{OS}$ or ground via the switch S5. The control terminal of transistor Q2 is used for receiving a bias voltage Vbias. A second terminal of transistor Q2 is coupled with the first terminal of transistor Q1, and a first terminal is used for outputting the proportion current Ir.

Here the switches S1 and S2 are closed sequentially to provide the threshold voltage Vb and the signal Vx to be detected to the first end of the storage capacitor CH, respectively. The threshold voltage Vb and the offset voltage of the signal Vx to be detected are stored in the capacitor CH. The transistor Q1 and the resistor R1 are used to convert the offset voltage on the storage capacitor CH into a current signal and output it through transistor Q2. Here, a cascade structure of the transistors Q2 and Q1 is used to increase a source impedance of the current signal Ir, and the selection of the bias voltage Vbias needs to ensure that the transistor Q2 still operates in a linear state when the current signal Ir is at the maximum value of design. It should be noted that the transistor Q2 is mainly used to improve performance of the voltage-to-current conversion circuit 120. In other embodiments, the transistor Q2 may be omitted, which is not limited by the embodiments of the present disclosure.

Moreover, the first end of the storage capacitor CH is also couple to ground via the switch S3, which is used to ground the storage capacitor CH to reset charge on the capacitor.

In this embodiment, the transistors Q1 and Q2 are, for example, NMOS transistors, in which the first, second, and control terminals are drain, source, and gate of the NMOS transistor, respectively.

The current-type successive approximation quantizer 130 includes a current source array (also known as a weighted current array or current-steering DAC) 131, an operational amplifier AMP1, and a comparator COMP. The current source array 131 is used to generate a reference current Ic. The operational amplifier AMP1 has two input terminals and one output terminal. A first input terminal is coupled with the first terminal of the transistor Q2 and an output of the current source array 131, A second input terminal is coupled to a clamping voltage Vforce, and an output terminal is coupled with an input terminal of the comparator COMP. The comparator COMP is used to quantify an output of the operational amplifier AMP1 to be a comparison result. Here, the operational amplifier AMP1 takes the reference current Ic output by the current source array 131 as a load. The transistor Q2 is used as a current sink, and the current source array 131 is used as a current source, both of which are coupled with the first input terminal of the operational amplifier AMP1 as mutual loads. The operational amplifier AMP1 amplifies and outputs a voltage difference between a voltage at a joint of the proportional current Ir and the reference current Ic and a clamping voltage Vforce. The comparator COMP outputs the final comparison result "0" or "1" according to an amplified voltage difference of the operational amplifier AMP1.

Figure 2:
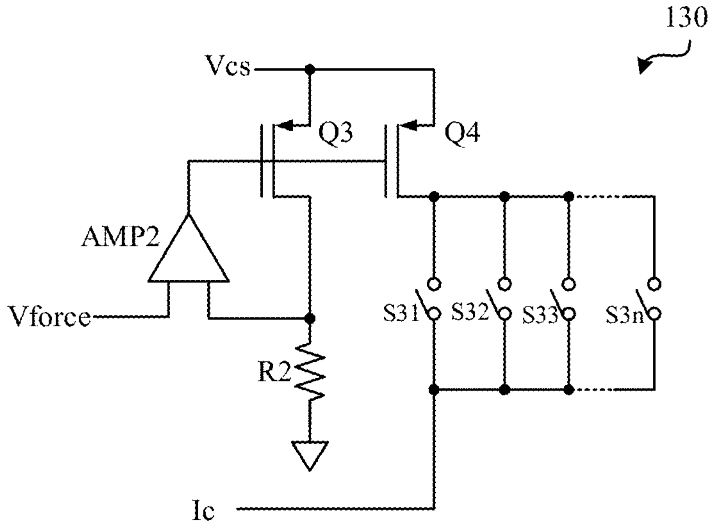
FIG. 2 shows a schematic circuit diagram of a current source array shown in FIG. 1.

Further, as shown in FIG. 2, the current source array 131 according to the present embodiment includes an operational amplifier AMP2, a resistor R2, transistors Q3 and Q4, and a plurality of switch branches S31 to S3*n*. Here, the transistor Q3 and the resistor R2 are coupled between a power supply terminal Vcs and ground. The operational amplifier AMP2 has two input terminals and one output terminal. A first input terminal is coupled with a first end of the resistor R2, a second input terminal is coupled to the clamping voltage Vforce, and an output terminal is coupled with a control terminal of the transistor Q3. When the operational amplifier AMP2 operates in a feedback loop, the current Iref=Vforce/R2 is obtained for the transistor Q3. The transistor Q4 and the transistor Q3 constitutes a current mirror, which is used to mirror the current Iref into the switching branches S31-S3*n*. A first terminal of the transistor Q4 is coupled to the power supply terminal Vcs, a second terminal of the transistor Q4 is coupled with a common terminal of the switching branches S31-S3*n*, and a control terminal of the transistor Q4 is coupled with the control terminal of the transistor Q3. The switch branches S31~S3*n*, for example, are a binary-weighted current source array consisting of MOS transistors with an aspect ratio of binary weighting, which can be switched by the switching branches S31~S3*n* to obtain the required reference current Ic at another common terminal. In this embodiment, the reference current Ic has a fixed current value. The current value is selected mainly in view of a detection scenario. For example, in a fast and high-precision comparison scenario, the current value of the reference current Ic is large; in a power-saving comparison scenario, the current value of the reference current Ic is small.

In this embodiment, the transistors Q3 and Q4 are, for example, PMOS transistors, the first terminals, the second terminals and the control terminals of which are source, drain and gate of a PMOS transistor, respectively.

Referring back to FIG. 1, in some embodiments, the threshold voltage generation circuit 110 may be implemented by a capacitive digital-to-analog converter (DAC), which may include a plurality of weight capacitors, such as binary weight capacitors $2^N$C . . . C, and a plurality of switches that generate a threshold voltage Vb corresponding to the signal Vx to be detected by controlling a plurality of switching in the capacitive DAC. In other embodiments, the detection circuit 100 may further include a register array 140 for storing a binary control code corresponding to the signal Vx to be detected. The binary control code is used to generate a corresponding threshold voltage by controlling switching of the capacitive DAC 110. It can be understood that the circuit structure of the capacitive DAC and the circuit principle of converting the binary control code to a corresponding analog voltage are conventional techniques in the art and will not be described further herein.

Figure 3:
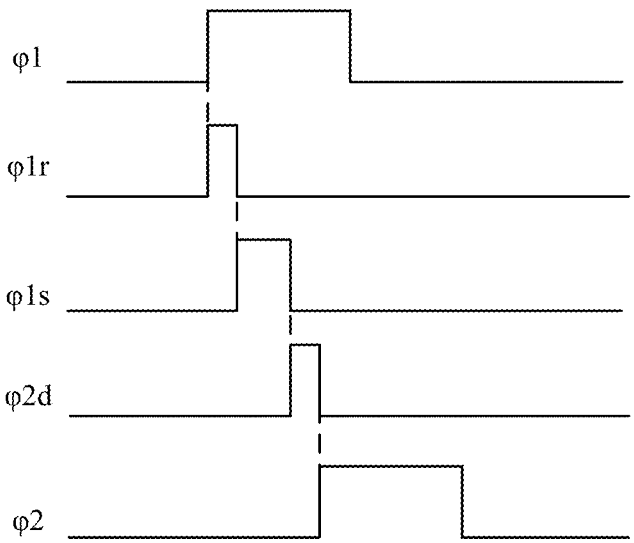
FIG. 3 shows timing charts of the detection circuit according to the first embodiment of the present disclosure.

FIG. 3 shows timing charts of the detection circuit according to the first embodiment of the present disclosure. In FIG. 3, signal φ1 is used to control on and off states of the switches S1 and S4, signal φ1*r* is used to control on and off states of the switch S3, and signal φ2 is used to control on and off states of the switch S2. The detection circuit according to this embodiment functions at two stages: a threshold establishment stage during which signal φ1 is at a high level, and a detection stage during which signal φ2 is at a high level. The threshold detection stage further includes a first sub-stage during which signal φ1*r* is at a high level and a second sub-stage during which signal φ1*s* is at a high level. The operation principle of the detection circuit according to this embodiment will be further explained below with reference to FIG. 3.

First, signal φ1 is flipped to a high level, the switches S1 and S4 are closed. The switch S1 connects a first end of the storage capacitor CH with an output of the capacitive DAC 110, and the switch S4 connects a control terminal and a first terminal of the transistor Q1. At the same time, signal φ1*r* is flipped to a high level, the switch S3 is closed. The first end of the storage capacitor CH is grounded for resetting charge in the capacitor. When signal φ1*r* is flipped to a low level, signal φ1*s* is flipped to a high level. The capacitive DAC 110 is switched according to a control code provided by the register array 140, outputs the threshold voltage Vb, and stores it on the storage capacitor CH.

Then, signal φ2 is flipped to a high level, the switch S2 is closed. The switch S2 connects the first end of the storage capacitor CH with the input terminal for receiving the signal Vx to be detected, and the signal Vx to be detected is provided to the storage capacitor CH. Since the threshold voltage Vb has been stored on the storage capacitor CH, an offset voltage of the signal Vx to be detected with respect to the threshold voltage Vb is converted into a proportional current by the transistor Q1 and the resistor R1, and a comparison result is output according to the proportional current, by quantizing the proportional current with the following Further, when it is necessary to perform further differentiation outside a window after obtaining the signal Vx to be detected, for example, when an operation voltage at a load point of sampling needs to be subtracted by a voltage drop at the return path in real time, an offset voltage $V_{OS}$ may be coupled to the voltage-to-current conversion circuit 120 via the differential sampling switch S5 at a detection stage φ2.

Further, delay signal φ2*d* before signal φ2 is also introduced in FIG. 3, which is used to avoid simultaneous close of the switches in the circuit.

Figure 4:
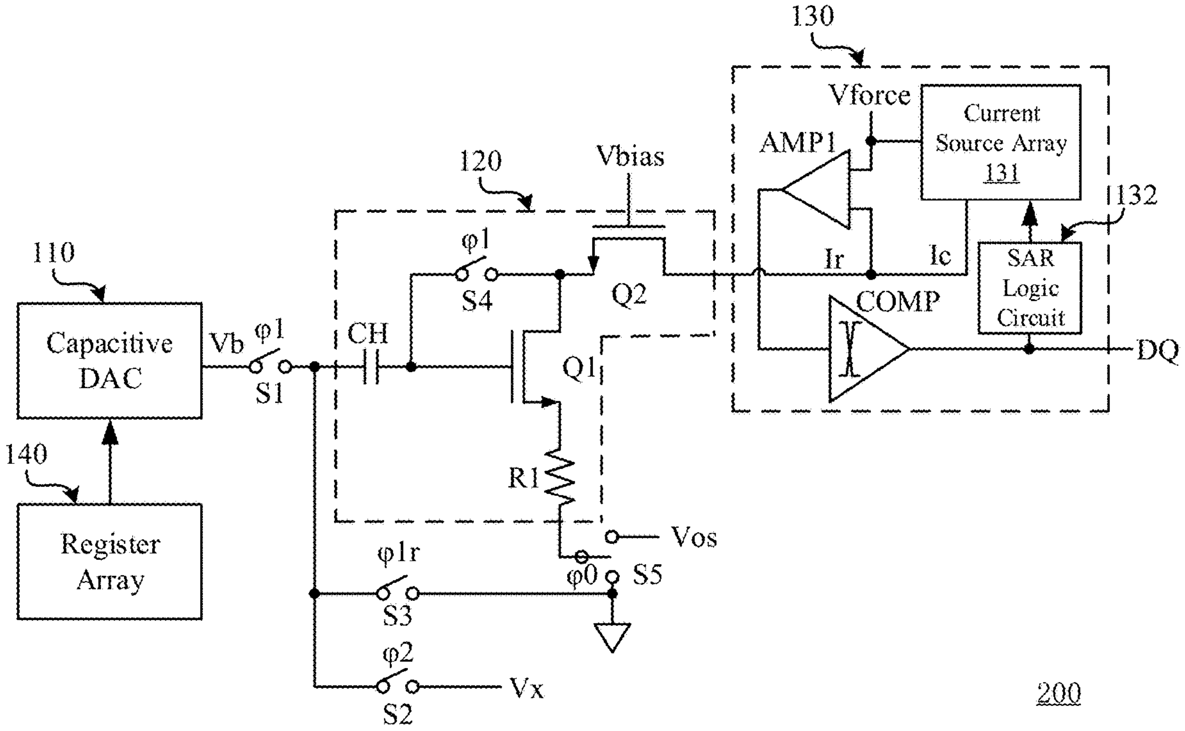
FIG. 4 shows a schematic diagram of structure of a detection circuit according to a second embodiment of the present disclosure.

FIG. 4 shows a schematic diagram of structure of a detection circuit according to a second embodiment of the present disclosure. The difference between the detection circuit 200 according to this embodiment and the detection circuit 100 according to the first embodiment is: a detection result is output as a quantization result of the part of the signal Vx to be detected within a window defined by the threshold voltage, that is, a digital result of the part of the signal Vx to be detected within the window. In this embodiment, the reference current Ic provided by the current source array 131 has a varied current value. The current value of the reference current Ic is adjusted in a successive approximation manner to finally obtain a quantization result.

Further, compared with the detection circuit 100 according to the first embodiment, in the detection circuit 200 according to the second embodiment, the current-type successive approximation quantizer 130 further includes an SAR logic circuit 132, which is used to control successive approximation conversion (SAR) in the current source array 131 according to a comparison result of the comparator COMP output "0" and "1", and continuously generates various bits of the SAR ADC from high to low in a successive approximation manner, until the end of quantization, and finally obtains a digital result of the signal Vx to be detected within the window. It can be understood that the principle of the SAR logic circuit 132 that controls the SAR conversion in the current source array 131 according to an output of the comparator COMP is a conventional technique, and will not be described further herein.

It should be noted that the detection circuit 200 according to this embodiment can also be controlled using the timing charts shown in FIG. 3. Compared with the detection circuit 100 according to the first embodiment, the only difference is: signal φ2 is at a high level at the detection stage. When signal φ2 is at a high level, the signal Vx to be detected is also provided to the storage capacitor CH, and then an offset voltage of the signal Vx to be detected with respect to the threshold voltage Vb is converted into a proportional current via the transistor Q1 and the resistor R1. Then, the comparator COMP and the amplifier AMP are used with the current source array 131 as a load to output a comparison result. After that, the detection circuit 200 according to this embodiment further includes an SAR logic circuit 132, which controls the SAR conversion in the current source array 131 according to the comparison result, and finally obtains a quantization result of the signal Vx to be detected.

It should be noted that the detection circuit 200 according to this embodiment, as a further improvement of the detection circuit 100, may have the functions of both threshold comparison and signal quantization. When enabling the threshold comparison, only the SAR logic circuit 132 needs to be disconnected, so that the current source array 131 outputs a reference current Ic having a constant current value. When enabling the signal quantization, only the SAR logic circuit 132 needs to be connected to the circuit again. Finally, both the functions of threshold comparison and quantization are realized in one circuit at the same time, which can greatly reduce the size and cost of the circuit.

Figure 5:
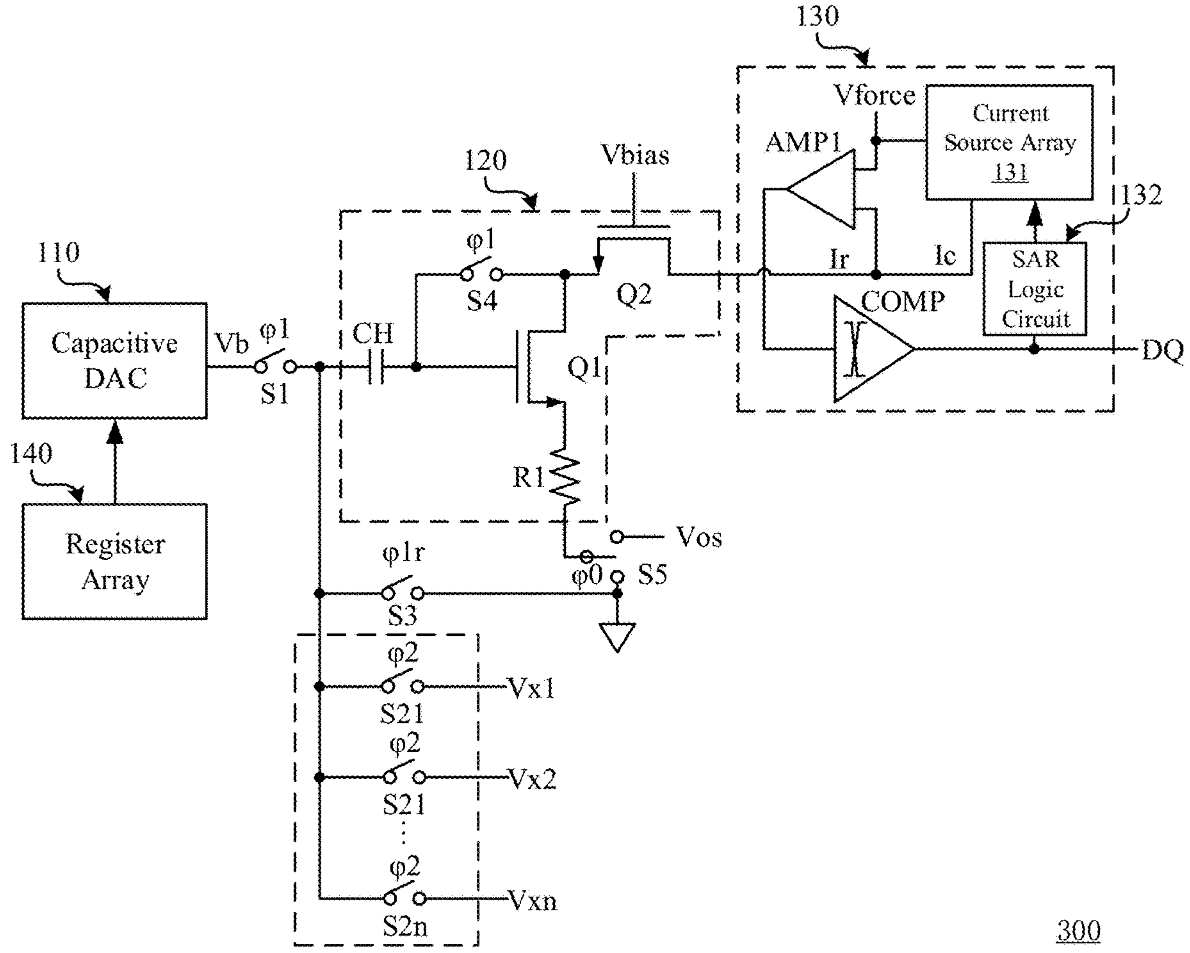
FIG. 5 shows a schematic diagram of structure of a detection circuit according to a third embodiment of the present disclosure.
Figure 6:
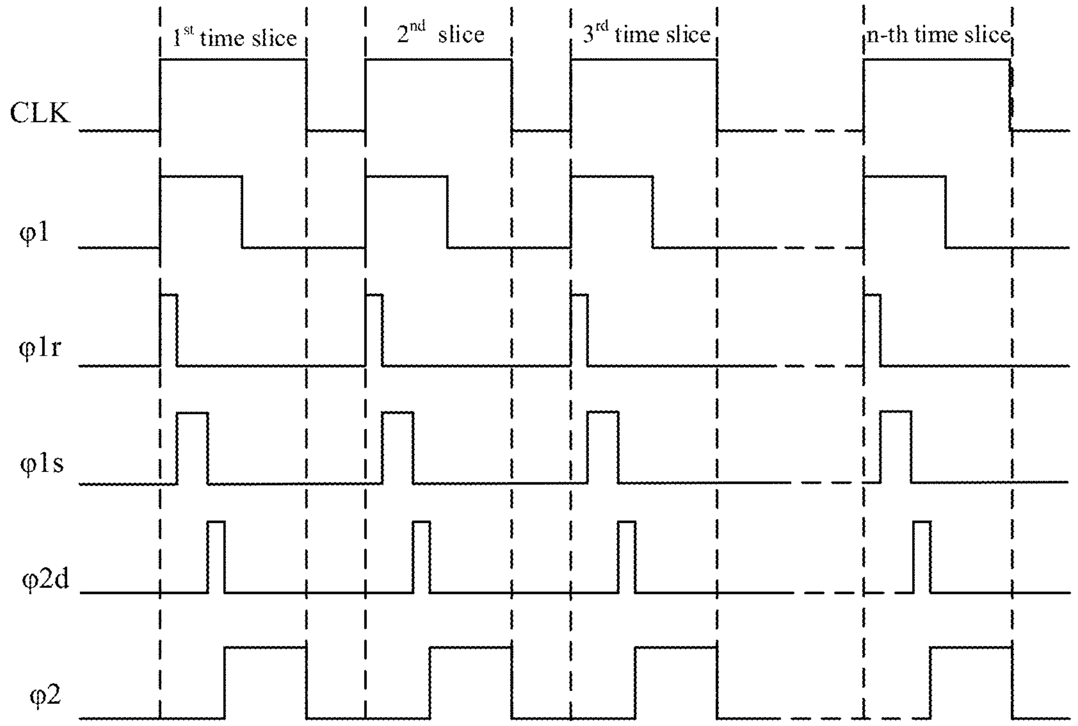
FIG. 6 shows timing charts of the detection circuit according to a third embodiment of the present disclosure.

FIGS. 5 and 6 show a schematic diagram of structure and timing charts of the detection circuit according to a third embodiment of the present disclosure, respectively. The difference between the detection circuit 300 according to this embodiment and the detection circuit 200 according to the second embodiment is: The detection circuit 300 includes a plurality of input terminals and a plurality of switches S21 to S2*n*. The detection circuit 300 detects signals Vx1 to Vxn to be detected at the plurality of input terminals in a time-division manner according to a certain beat, and performs a threshold comparison or quantization operation on the input signals to be detected according to specific requirements. As shown in FIG. 6, the timing signal CLK includes a first time slice to an n-th time slice. The detection circuit 300 is configured to detect the signal to be detected at each input terminal in a corresponding time slice. Further, the operations of the detection circuit 300 in each time slice further includes a threshold establishment stage during which signal φ1 is at a high level, and a detection stage during which signal φ2 is at a high level. The threshold establishment stage further includes a first sub-stage during which signal φ1*r* is at a high level and a second sub-stage during which signal φ1*s* is at a high level.

Further, a register array 140 of the detection circuit 300 according to this embodiment further stores a plurality of binary control codes, which corresponds to the signal to be detected at the plurality of input terminals. The capacitive DAC 110 is configured to generate a threshold voltage Vb corresponding to the signal to be detected that is currently input, according to the binary control code provided by the register array 140 at the threshold establishment stage.

Taking the signal Vx1 to be detected as an example, when signal φ1 is at a high level, the detection circuit 300 is at the threshold establishment stage. The switch S1 connects a first end of the storage capacitor CH with an output of the capacitive DAC 110, and the switch S4 connects a first terminal and a control terminal of the transistor Q1. At the same time, signal φ1*r* is at a high level, and the storage capacitor CH is discharged to ground for resetting charge on the capacitor. When signal φ1*r* is flipped to a low level, signal φ1*s* is flipped to a high level. The capacitive DAC 110 generates a threshold voltage Vb corresponding to the signal Vx1 to be detected according to the binary control code provided by the register array 140. When signal φ1*s* is flipped to a low level, after a dead time φ2*d*, signal φ2 is flipped to a high level. The detection circuit 300 enters a detection stage. The switch S21 is closed to couple the signal Vx1 to be detected to the storage capacitor CH. At the same time, a comparator or current-type SAR conversion is established in a subsequent stage according to the specific requirement of the signal Vx1 to be detected. A comparison result between the signal Vx1 to be detected and the threshold voltage Vb, or a quantization result of the signal Vx1 to be detected within a window defined by the threshold voltage Vb is output. Similarly, when it is necessary to perform further differentiation outside a window after obtaining the signal Vx1 to be detected, a certain offset voltage $V_{OS}$ may be coupled to the voltage-to-current conversion circuit 120 via the differential sampling switch S5 at a detection stage φ2.

In other embodiments, the present disclosure also provides a power management system including the detection circuit described above, the detection circuit is coupled with a power supply unit through a power management bus (PMBus) interface, to read various parameters such as an input voltage, an output voltage, or an output voltage offset of the power supply unit, and to compare and quantify threshold values of these parameters. All of the parameters may be monitored and set using a single circuit structure, greatly reducing the circuit cost of power management.

In summary, the detection circuit according to the present disclosure generates a lower voltage limit by a capacitive DAC, converts a signal to be detected into a current with respect to the lower voltage limit by a voltage-to-current conversion circuit, quantizes the current by a current-type successive approximation quantizer, and finally obtains a comparison result of the signal to be detected and the lower voltage limit, or a quantization result of the signal to be detected in a window. This simpler circuit structure significantly reduces the area of the power management system utilizing this detection circuit, thereby decreasing the circuit cost.

In a further embodiment, the detection circuit reuses the current source array in the current-type successive approximation quantizer as a load for threshold comparison, or for quantization of the proportional current, which is beneficial for decreasing the number of circuit components and further reducing the circuit area.

In a further embodiment, the detection circuit uses a combination of the capacitive DAC and the current-type SAR ADC to quantize the parameters within a window. Since a quantization range of the current-type SAR ADC covers different quantization bits of the capacitive DAC, a plurality of times of quantization may be performed by different combinations of the DAC bits and the ADC bits for the same parameters, so that an averages of the plurality of times of quantization may reduce a quantization error and improve quantization accuracy.

It will be appreciated by those of ordinary skill in the art that the words "during", "when", and "while" used herein in connection with circuit operation are not strict terms for actions that occur immediately at the beginning of a start action, but that there may be some small but reasonable one or more delays after a reaction action initiated by a start action, such as various transmission delays, etc. As used herein, the word "approximately" or "substantially" means an element has a parameter that is expected to approximate the declared value or location. However, as is well known in the art, there are always minor deviations that make it difficult to have the value or position to be strictly the declared value. It has been properly determined in the art that a deviation of at least ten percent (10%) is a reasonable deviation from the precise desired target described (for a doping concentration of semiconductor, at least twenty percent (20%)). When a signal is described in the context of a state, an actual voltage value or logic state of the signal (e.g. "1" or "0") depends on whether positive or negative logic is used.

It should also be noted that in this description, relational terms such as first and second are merely used to distinguish one entity or operation from another, and do not necessarily require or imply that there is any such actual relationship or sequence among these entities or operations. Furthermore, the word "include", "contain", or any other variation thereof is intended to cover non-exclusive inclusion, so that a process, method, article, or device including a series of elements includes not only those elements, but other elements that are not explicitly listed or elements inherent to such process, method, article, or device. In the absence of further limitations, elements defined by the phrase "comprises a•••" do not exclude the presence of additional identical elements in the process, method, article, or device that includes the elements.

Embodiments in accordance with the present disclosure As described above, these embodiments are not exhaustive in all details and are not intended to limit the disclosure to the specific embodiments described. Obviously, a lot of modifications and changes can be made based on the above description. The present specification selects and specifically describes these embodiments in order to better explain the principles and practical applications of the present disclosure, so that those skilled in the art can make good use of the present disclosure and its modifications on the basis of the present disclosure. This disclosure is limited only by the claims and their full scope and equivalents.

What is claimed is:

1. A detection circuit, comprising:

a threshold voltage generation circuit for generating a threshold voltage;

a voltage-to-current conversion circuit for converting an offset voltage of a signal to be detected with respect to the threshold voltage into a proportional current;

a current-type successive approximation quantizer which is used to obtain a detection result by quantizing the proportional current; and a differential sampling switch configured to provide the voltage-to-current conversion circuit with an offset voltage or a reference ground, wherein the voltage-to-current conversion circuit comprises:

a storage capacitor, with a first end being coupled with an output of the threshold voltage generation circuit and an input terminal for receiving the signal to be detected;

a first transistor having a control terminal being coupled with a second end of the storage capacitor;

a first resistor having a first end being coupled with a second terminal of the first transistor, and a second end being coupled to the offset voltage or the reference ground via the differential sampling switch; and a second transistor having a control terminal for receiving a bias voltage, a second terminal being coupled with the first terminal of the first transistor, and a first terminal for outputting the proportional current.

2. The detection circuit according to claim 1, wherein the detection result is a comparison result of the signal to be detected and the threshold voltage, or a quantization result of the signal to be detected within a window defined by the threshold voltage.

3. The detection circuit according to claim 1, wherein the current-type successive approximation quantizer comprises:

an operational amplifier having a first input terminal being coupled with the first terminal of the second transistor and a second input terminal being coupled to a clamping voltage;

a current source array which is used to generate a reference current according to the clamping voltage and provide the reference current to the first input terminal of the operational amplifier, and a comparator which is coupled with an output terminal of the operational amplifier, and is used to quantize an output of the operational amplifier into the comparison result.

4. The detection circuit according to claim 3, wherein the reference current provided by the current source array has a constant current value when the detection result is a result of comparing the signal to be detected with the threshold voltage.

5. The detection circuit according to claim 3, wherein the reference current provided by the current source array has a varied current value when the detection result is a quantization result of the signal to be detected within the window defined by the threshold voltage, the quantization result being obtained by adjusting the current value of the reference current.

6. The detection circuit according to claim 5, wherein the current-type successive approximation quantizer further comprises:

an SAR logic circuit which controls switching operations of the current source array according to the comparison result, and adjusts a current value of the reference current in a successive approximation manner, until the quantization ends.

7. The detection circuit according to claim 1, further comprising:

a first switch, configured to couple a first end of the storage capacitor with an output of the threshold voltage generation circuit at a threshold establishment stage;

a second switch, configured to couple the first end of the storage capacitor with the input terminal for receiving the signal to be detected at a detection stage.

8. The detection circuit according to claim 7, further comprising:

a third switch, configured to couple the first end of the storage capacitor to ground at a first sub-stage of the threshold establishment stage for resetting charge.

9. The detection circuit according to claim 8, wherein the threshold establishment stage further includes a second sub-stage following the first sub-stage, and the threshold voltage generation circuit is configured to generate the threshold voltage at the second sub-stage.

10. The detection circuit according to claim 7, wherein the voltage-to-current conversion circuit further comprises:

a fourth switch, configured to be coupled the control terminal and the first terminal of the first transistor at the threshold establishment stage.

11. The detection circuit according to claim 1, wherein the detection circuit has a plurality of input terminals, and the detection circuit is configured to detect signals to be detected at the plurality of input terminals in a time-division manner.

12. The detection circuit according to claim 11, further comprising a register array for storing a plurality of control codes corresponding to the signals to be detected at the plurality of input terminals, and the threshold voltage generation circuit generating threshold voltages respectively according to the control codes provided by the register array.

13. The detection circuit according to claim 12, wherein the threshold voltage generation circuit is a capacitive digital-to-analog converter.

14. A power management system, comprising the detection circuit according to claim 1.

* * * * *